United States Patent
Oshima (10) Patent No.: US 8,736,335 B2
(45) Date of Patent: May 27, 2014

(54) FRONT-END MODULE HAVING LOW INSERTION LOSS

(71) Applicant: Taiyo Yuden Co., Ltd., Tokyo (JP)

(72) Inventor: Shinpei Oshima, Tokyo (JP)

(73) Assignee: Taiyo Yuden Co., Ltd., Tokyo (JP)

(*) Notice: Subject to any disclaimer, the term of this patent is extended or adjusted under 35 U.S.C. 154(b) by 0 days.

(21) Appl. No.: 13/728,654

(22) Filed: Dec. 27, 2012

(65) Prior Publication Data

US 2013/0169333 A1 Jul. 4, 2013

(30) Foreign Application Priority Data

Dec. 28, 2011 (JP) .................. 2011-289511

(51) Int. Cl.
*H03H 11/16* (2006.01)

(52) U.S. Cl.
USPC .......................................... 327/237; 327/231

(58) Field of Classification Search
USPC .......................................... 327/231, 233, 237
See application file for complete search history.

(56) References Cited

U.S. PATENT DOCUMENTS 7,282,979 B2 * 10/2007 Tanaka et al. .................. 327/237
8,207,774 B2 * 6/2012 Nagayama .................... 327/231

FOREIGN PATENT DOCUMENTS

JP 2005-064778 3/2005

* cited by examiner

*Primary Examiner* — Hai L Nguyen
(74) *Attorney, Agent, or Firm* — Pillsbury Winthrop Shaw Pittman, LLP (57) ABSTRACT

One object is to provide a front-end module with a shared output terminal wherein an input impedance is readily matched and an insertion loss is suppressed. In accordance with one aspect, the front-end module 10 includes an input terminal, output terminals, a first filter circuit that passes signals in a first passband, a second filter circuit that passes signals in a second passband, a switch that is disposed between the input terminal and the first and second filter circuits and selectively connects the input terminal to the first and second filter circuits, and a matching circuit. The second filter circuit includes phase shifters.

5 Claims, 8 Drawing Sheets

FRONT-END MODULE HAVING LOW INSERTION LOSS

CROSS-REFERENCE TO RELATED APPLICATIONS

This application is based on and claims the benefit of priority from Japanese Patent Application Serial No. 2011-289511 (filed on Dec. 28, 2011), the contents of which are hereby incorporated by reference in their entirety.

TECHNICAL FIELD

The invention relates to a front-end module, and in particular, to a front-end module used for a multi-band communication device.

BACKGROUND

Multi-band mobile phones capable of handling telephone calls and transmitting data by a plurality of communication methods have been widely used. These multi-band mobile phones are generally provided with a front-end module made by integrating a RF circuit composed of one or more high-frequency switches, filters, and amplifying elements into a single package. The front-end module divides a received multi-band signal containing superimposed signals of a plurality of frequency bands into signals of individual frequency bands, and outputs the divided signal to a subsequent circuit such as a receiver.

There are some publications proposing a downsized font-end module in which an amplifying element is shared by a plurality of frequency bands. For example, Japanese Patent Application Publication No. 2005-64778 (the "'778 Publication") discloses a front-end module with shared output terminals, wherein a pair of bandpass filters having different passbands are disposed in parallel between a common input terminal and common output terminals, and the input end of each of the pair of bandpass filters is connected to a switch and the output end of each of the pair of bandpass filters is connected to another switch (see FIG. 8-B in the '778 Publication).

SUMMARY

Thus, the front-end module disclosed in the '778 Publication is provided with a switch at each of the input and output ends of the filters so that each of the filters is actuated while being separated from the other. Accordingly, the input impedance of each of the filters is readily matched to a reference impedance. However, this front-end module is subject to a large insertion loss because a received signal is attenuated when it passes through the switches. In view of these limitations, various embodiments of the present invention provide front-end modules with a shared output terminal wherein an input impedance is readily matched and an insertion loss is suppressed. Other objects of the present invention will be understood based on the following detailed description and attached drawings.

A font-end module according to an embodiment of the present invention comprises: an input terminal; one or more output terminals; a first filter circuit comprising a first input port and one or more first output ports and disposed between the input terminal and the one or more output terminals; a second filter circuit comprising a second input port and one or more second output ports and disposed between the input terminal and the one or more output terminals; a switch disposed between the input terminal and the first and second input ports, for connecting the input terminal selectively to the first and second filter circuits; and a matching circuit disposed between the one or more output terminals and one or more junctions between the one or more first output ports and the one or more second output ports. In the embodiment, the first filter circuit comprises a first filter element including a third input port and one or more third output ports, for passing a signal in a first passband; and the second filter circuit comprises a second filter element including a fourth input port and one or more fourth output ports, for passing a signal in a second passband different from the first passband, and one or more first phase shifters disposed between the one or more fourth output ports of the second filter element and the matching circuit. In the embodiment, a phase of a reflection coefficient in the first passband of the second filter element as seen from the one or more fourth output ports under a condition where the switch is switched to disconnect the input terminal from the second filter circuit, the one or more first phase shifters are removed, and the one or more junctions are opened, is leading, by 0° to 180°, a phase of a reflection coefficient in the second passband of the first filter element as seen from the one or more third output ports under a condition where the switch is switched to disconnect the input terminal from the first filter circuit and the one or more junctions are opened.

Thus, the various embodiments of the present invention provide front-end modules with a shared output terminal wherein an impedance is readily matched and an insertion loss is suppressed.

BRIEF DESCRIPTION OF THE DRAWINGS

FIG. 8*b* is a Smith chart showing the frequency characteristics of an input impedance of the front-end module 10

(including phase shifters 50 and 52) as seen from the input terminal 12 and the output terminals 40 during operation of the bandpass filter 48.

DESCRIPTION OF THE PREFERRED EMBODIMENTS

Figure 1:
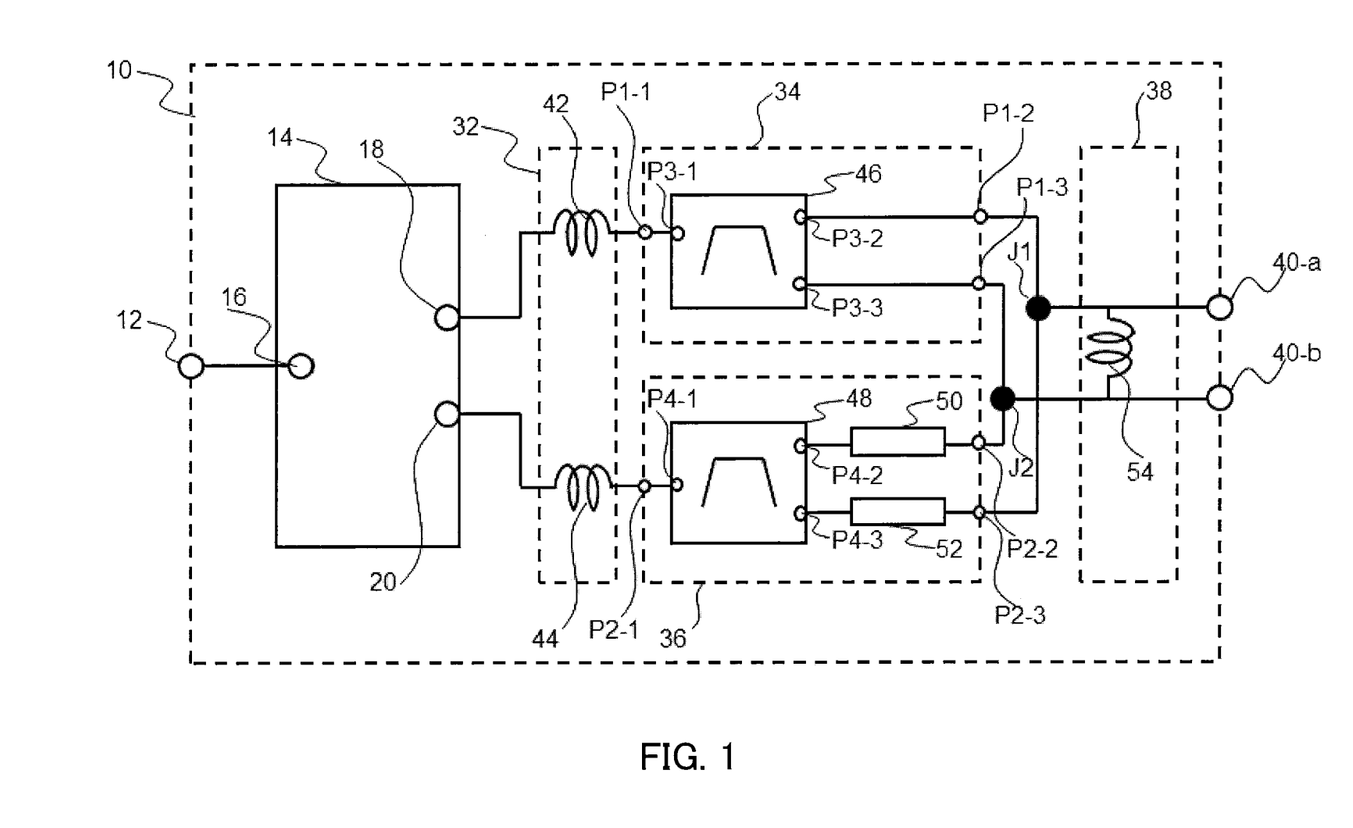
FIG. 1 is a circuit diagram of a front-end module according to an embodiment of the present invention.

Various embodiments of the present invention will now be described with reference to the attached drawings. FIG. 1 is a circuit diagram showing a front-end module 10 according to an embodiment of the present invention. As shown, the front-end module 10 according to the embodiment comprises: a switch 14 connected to an antenna terminal 12; a first filter circuit 34 and a second filter circuit 36 each connected subsequently to the switch 14 via a switch-adapted matching circuit 32; a matching circuit 38 connected to the outputs of the first filter circuit 34 and the second filter circuit 36; and balanced output terminals 40-a, 40-b. A multiband signal is inputted from an antenna (not shown) via the antenna terminal 12 and is transmitted selectively to one of the first filter circuit 34 and the second filter circuit 36 in accordance with the switching operation of the switch 14. The signal is passed through the first filter circuit 34 or the second filter circuit 36 and is outputted to a subsequent receiver (not shown) from the output terminals 40-a, 40-b. This front-end module 10 can also be used to send signals. That is, a transmitter (not shown) can be connected subsequently to the output terminals 40-a, 40-b, and a signal from this transmitter can be wirelessly transmitted from an antenna via the antenna terminal 12. In this specification, the output terminals 40-a, 40-b are collectively termed "output terminals 40" or simply "output terminals."

The switch 14 in an embodiment is, for example, a single pole dual throw (SPDT) switch comprising a first terminal 16 connected to the antenna terminal 12, a second terminal 18, and a third terminal 20. The switch 14 further comprises a voltage supplying terminal (not shown) for supplying voltage and a control terminal (not shown) for inputting a control signal. The first terminal 16 is connected selectively to one of the second terminal 18 and the third terminal 20 based on a control signal inputted from the control terminal. The switch 14 may have a desired number of terminals depending on a particular circuit configuration. For example, the switch 14 may be a SP3T switch, a SP4T switch, a SP8T switch, a DPDT switch, or a DP4T switch. An example of a switching element constituting the switch 14 is a field-effect transistor.

Disposed subsequently to the switch 14 is the switch-adapted matching circuit 32 for matching an input impedance of the switch 14 to a reference impedance. The switch-adapted matching circuit 32 includes, for example, an inductor 42 of which one end is connected to the second terminal 18 of the switch 14 and the other end is connected to a first bandpass filter 46 (described later), and an inductor 44 of which one end is connected to the third terminal 20 of the switch 14 and the other end is coupled to a second bandpass filter 48 (described later). The input impedance of the switch 14 can be matched to the reference impedance by a publicly known method of adjusting the inductance values of the inductor 42 and the inductor 44. The specific configuration of the switch-adapted matching circuit 32 is not limited to that illustrated in FIG. 1 and may be modified appropriately.

Disposed subsequently to the switch-adapted matching circuit 32 are the first filter circuit 34 and the second filter circuit 36. The first filter circuit 34 comprises an unbalanced port P1-1 and a pair of balanced ports P1-2, P1-3, and is connected to the switch-adapted matching circuit 32 via the unbalanced port P1-1. The second filter circuit 36 comprises an unbalanced port P2-1 and a pair of balanced ports P2-2, P2-3, and is connected to the switch-adapted matching circuit 32 via the unbalanced port P2-1. The junction J1 between the balanced port P1-2 of the first filter circuit 34 and the balanced port P2-3 of the second filter circuit 36 is connected to the output terminal 40-a via the matching circuit 38. The junction J2 between the balanced port P1-3 of the first filter circuit 34 and the balanced port P2-2 of the second filter circuit 36 is connected to the output terminal 40-b via the matching circuit 38. In this specification, the balanced port P1-2 and the balanced port P1-3 are also collectively termed "first output ports," and the balanced port P2-2 and the balanced port P2-3 are also collectively termed "second output ports."

The first filter circuit 34 comprises the first bandpass filter 46 having a first passband. The first bandpass filter 46 transmits inputted signals within the first passband to the subsequent circuit while suppressing signals outside the first passband. FIG. 1 shows, as an example of the first bandpass filter 46, a balanced bandpass filter comprising an unbalanced port P3-1 and a pair of balanced ports P3-2, P3-3. The balanced first bandpass filter 46 converts an unbalanced signal inputted from the unbalanced port P3-1 into a balanced signal to be outputted from the balanced ports P3-2, P3-3.

The second filter circuit 36 comprises the second bandpass filter 48 having a second passband, and the phase shifters 50, 52. As the first bandpass filter 46, the second bandpass filter 48 illustrated in FIG. 1 comprises an unbalanced port P4-1 and a pair of balanced ports P4-2, P4-3, wherein an unbalanced signal inputted from the unbalanced port P4-1 is converted into a balanced signal and is outputted from each of the balanced ports P4-2, P4-3. In this specification, the balanced ports P3-2, P3-3 are collectively termed "third output ports," and the balanced ports P4-2, P4-3 are collectively termed "fourth output ports." The balanced port P4-2 is connected to the phase shifter 50, and the balanced port P4-3 is coupled to the phase shifter 52. The phase shifters 50, 52 comprise any distributed constant line such as a strip line or a micro strip line, and rotate the phase of an input signal by an amount in accordance with their line length. These phase shifters may consist of or comprise a concentrated constant element. In an embodiment, the wiring between the second bandpass filter 48 and the matching circuit 38 can be used as phase shifters 50, 52.

As will be described below, the phase of a reflection coefficient in the first passband of the second filter element 48 as seen from the balanced ports P4-2, P4-3 (the fourth output ports) under the condition where the switch 14 is switched to disconnect the input terminal 12 from the second filter circuit 36, the phase shifters 50, 52 are removed, and the junctions J1, J2 are opened (i.e., the junctions J1, J2 are disconnected from the filter element 48) leads, by 0° to 180°, the phase of a reflection coefficient in the second passband of the first filter element 46 as seen from the balanced ports P3-2, P3-3 (the third output ports) under the condition where the switch 14 is switched to disconnect the input terminal 12 from the first filter circuit 34 and the junctions J1, J2 are opened (i.e., the junctions J1, J2 are disconnected from the filter element 46). In an embodiment of the present invention, the phase shifters 50, 52 are provided to a filter circuit (the second filter circuit 36 in FIG. 1) including a bandpass filter (the second bandpass filter 48 in FIG. 1) that generates a reflected wave of one of the first filter circuit 34 and the second filter circuit 36 that has a leading phase.

In an embodiment, the first bandpass filter 46 and the second bandpass filter 48 may include a surface acoustic wave filter (SAW filter) and a bulk acoustic wave filter (BAW filter). The passbands of the first bandpass filter 46 and the second bandpass filter 48 may be, for example, various receiving bands or sending bands defined by Universal Mobile Telecommunication System (UMTS). The first bandpass filter 46 and the second bandpass filter 48 may be unbalanced bandpass filters that output unbalanced signals.

The matching circuit 38 is configured such that the input impedance of the front-end module 10 as seen from the antenna terminal 12 and/or the output terminals 40 is matched to an external circuit connected subsequently to the output terminals 40 in the passbands of the first bandpass filter 46 and the second bandpass filter 48. That is, the matching circuit 38 may be configured such that, when the first terminal 16 of the switch 14 is connected to the second terminal 18 to actuate the first bandpass filter 46, the input impedance of the front-end module 10 is matched to a reference impedance in the passband of the first bandpass filter 46, and when the first terminal 16 of the switch 14 is connected to the third terminal 20 to actuate the second bandpass filter 48, the input impedance of the front-end module 10 is matched to a reference impedance in the passband of the second bandpass filter 48. In an embodiment, the matching circuit 38 comprises an inductor 54 connected to the output terminals 40-a, 40-b. The matching circuit 38 will be further described below.

Thus, in a front-end module 10 according to an embodiment of the present invention, the output ports of the first filter circuit 34 and the second filter circuit 36 are connected to common output terminals 40-a, 40-b via the matching circuit 38, thereby suppressing an insertion loss compared to a conventional front-end module wherein a switch is provided subsequently to a pair of bandpass filters (see FIG. 8-B of The '778 Publication).

In a front-end module 10 according to an embodiment of the present invention, a matching circuit 38 (not a switch) is provided at the outputs of the first filter circuit 34 and the second filter circuit 36, and thus the first filter circuit 34 and the second filter circuit 36 are constantly connected to each other. Accordingly, when the switch 14 is switched to actuate one of the first bandpass filter 46 and the second bandpass filter 48, the non-actuated filter circuit acts as a reactance element on the actuated filter circuit. This action possibly causes the input impedance in the passband of the actuated filter circuit to deviate from the reference impedance, resulting in a deteriorated insertion loss of the front-end module 10. For example, when the switch 14 is switched to connect the first terminal 16 to the second terminal 18 and to actuate the first bandpass filter 46, the input impedance of the front-end module 10 is possibly deviated from the reference impedance in the first passband by the effect of the non-actuated second bandpass filter 48. In order to address the limitations, the matching circuit 38 is configured such that the effect of the non-actuated filter circuit on the impedance matching of the actuated filter circuit is canceled (more specifically, the element values and arrangement of the reactance elements constituting the matching circuit 38 is adjusted).

Each of the first bandpass filter 46 and the second bandpass filter 48 differently affects the impedance matching in the passband of the other (that is, the effect of the first bandpass filter 46 on the impedance matching in the second passband is different from the effect of the second bandpass filter 48 on the impedance matching in the first passband). As such, it is difficult to accurately cancel both the mutual effects of the first bandpass filter 46 and the second bandpass filter 48 on the impedance matching by only adjusting the element values of the reactance elements constituting the matching circuit 38. In an embodiment of the present invention, the phase of a reflection coefficient in the second passband of the first bandpass filter 46 as seen from the third output ports (the balanced ports P3-2, P3-3) under the condition where the switch 14 is switched to disconnect the first terminal 16 from the second terminal 18 (connect the first terminal 16 of the switch 14 to the third terminal 20) and the junctions J1, J2 are opened, is compared to the phase of a reflection coefficient in the first passband of the second bandpass filter 48 as seen from the fourth output ports (the balanced ports P4-2, P4-3) under the condition where the switch 14 is switched to disconnect the first terminal 16 from the third terminal 20 (connect the first terminal 16 of the switch 14 to the second terminal 18), the junctions J1, J2 are opened, and the phase shifters 50, 52 are removed. Based on the comparison, it is determined that one or more phase shifters (the phase shifters 50, 52 in the example shown in FIG. 1) are provided subsequently to the filter of which the phase of the reflection coefficient is leading by 0° to 180°. As will be described with reference to FIGS. 2 to 5, this arrangement accurately cancels the mutual effects of the first bandpass filter 46 and the second bandpass filter 48 on the impedance matching. Thus, the matching circuit 38 maintains the impedance matching in both the first bandpass filter 46 and the second bandpass filter 48.

Figure 2:
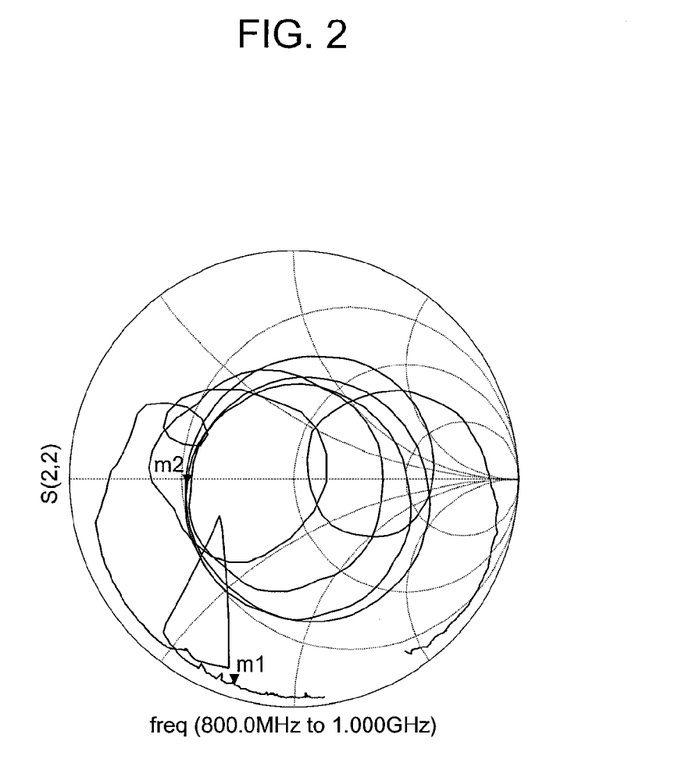
FIG. 2 is a Smith chart showing the frequency characteristics of an input impedance of a bandpass filter 46 as seen from balanced ports P3-2, P3-3.
Figure 3:
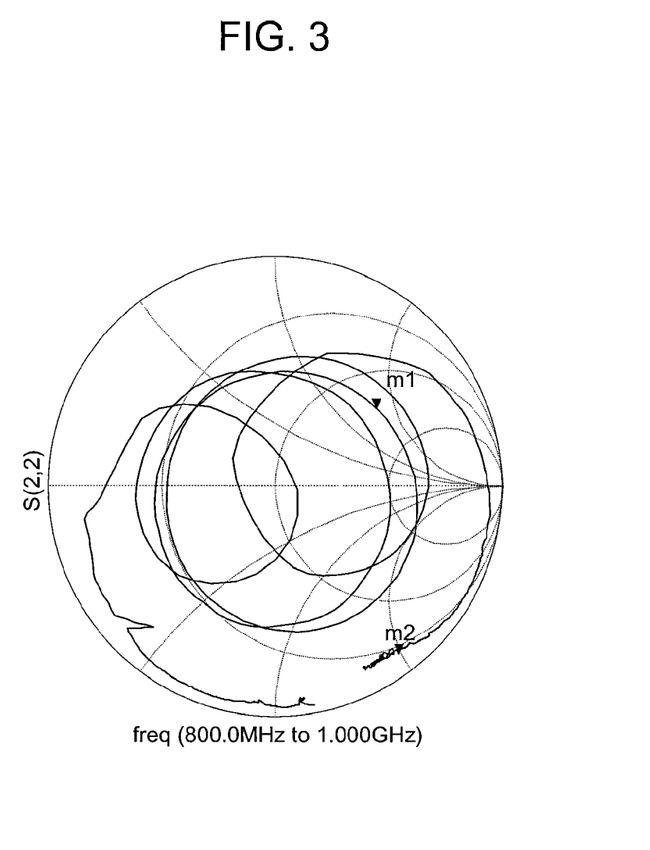
FIG. 3 is a Smith chart showing the frequency characteristics of an input impedance of a bandpass filter 48 as seen from balanced ports P4-2, P4-3.
Figure 4:
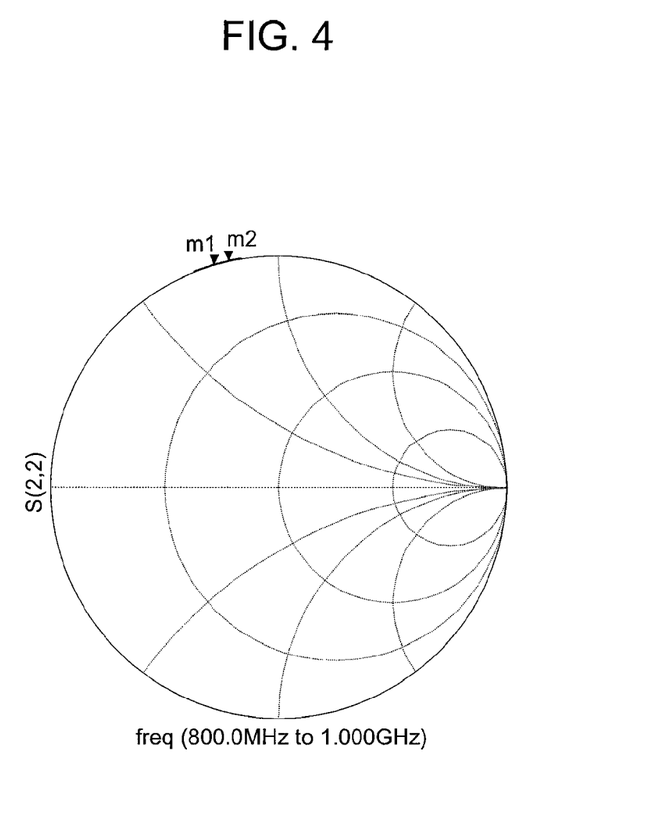
FIG. 4 is a Smith chart showing the frequency characteristics of an input impedance of a matching circuit 38 as seen from output terminals 40.
Figure 5:
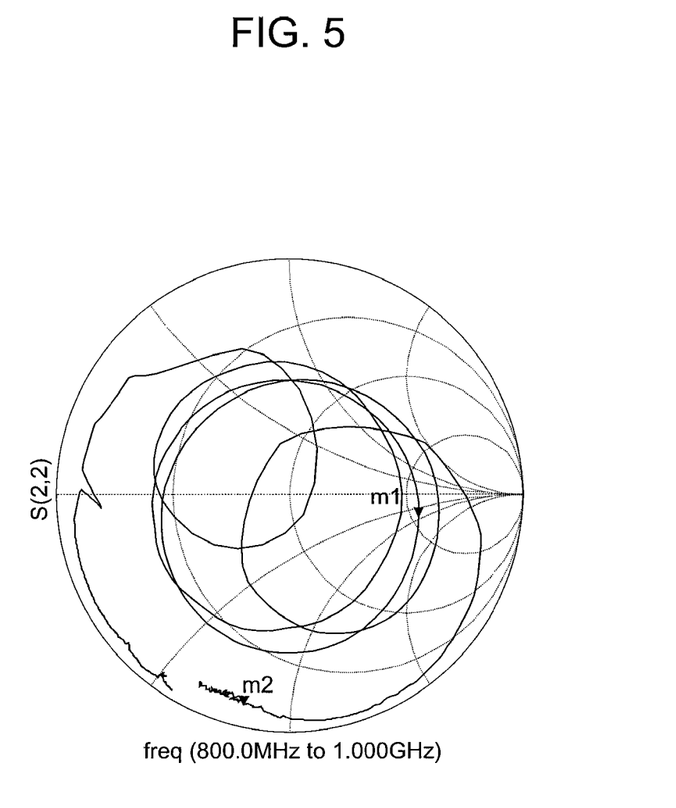
FIG. 5 is a Smith chart showing the frequency characteristics of an input impedance of a second filter circuit 36 as seen from junctions J1, J2.

Now with reference to FIGS. 2 to 5, an impedance matching using the phase shifters 50, 52 and the matching circuit 38 will be described. FIG. 2 is a Smith chart showing the frequency characteristics of an input impedance of the first bandpass filter 46 as seen from the balanced ports P3-2, P3-3 under the condition where the first terminal 16 of the switch 14 is disconnected from the second terminal 18 (the first terminal 16 of the switch 14 is connected to the third terminal 20) and the junctions J1, J2 are opened. FIG. 2 represents the simulation of an input impedance of the first bandpass filter 46 under the condition where a transformer is provided between the balanced ports P3-2, P3-3 to render the first bandpass filter 46 single-ended. FIG. 3 is a Smith chart showing the frequency characteristics of an input impedance of the second bandpass filter 48 as seen from the balanced ports P4-2, P4-3 under the condition where the first terminal 16 of the switch 14 is disconnected from the second terminal 20 (the first terminal 16 of the switch 14 is connected to the second terminal 18), the junctions J1, J2 are opened, and the phase shifters 50, 52 are removed. As does FIG. 2, FIG. 3 represents the simulation under the condition where the second bandpass filter 48 is rendered single-ended. FIG. 4 is a Smith chart showing the frequency characteristics of an input impedance of the matching circuit 38 alone (i.e., an input impedance of the matching circuit 38 under the condition where the junctions J1, J2 are opened in FIG. 1) as seen from the output terminals 40-a, 40-b. Further, FIG. 5 is a Smith chart showing the frequency characteristics of an input impedance of the second filter circuit 36 as seen from the balanced ports P2-2, P2-3 (second output ports) under the condition where the first terminal 16 of the switch 14 is disconnected from the third terminal 20 (the first terminal 16 of the switch 14 is connected to the second terminal 18), and the junctions J1, J2 are opened.

In the simulations, the passband of the bandpass filter 46 was set in the range of 925 to 960 MHz assigned for reception of the band VIII of UMTS, and the passband of the bandpass filter 48 was set in the range of 869 to 894 MHz assigned for reception of the band V of UMTS. The reference impedance on the unbalanced side was set at 50Ω, and the reference impedance on the balanced side was set at 100Ω. Further, both the inductance values of the inductors 42, 44 were set at 1.5 nH, and the inductance value of the inductor 54 was set at 13.5 nH. The line length for the phase shifters 50, 52 was set such that the phase shifters rotate an input signal of 0.95 GHz by 25°. In FIGS. 2 to 5, the central frequency of the passband of the first bandpass filter 46 is denoted by a marker m2, and the central frequency of the passband of the bandpass filter 48 is denoted by a marker m1.

As shown in FIG. 2, the first bandpass filter 46 lies in a capacitive area in the Smith chart wherein the marker m1 denotes the input impedance of the first bandpass filter 46; and thus the first bandpass filter 46 acts as a capacitive element on the second bandpass filter 48. Accordingly, when the second bandpass filter 48 is actuated with the first terminal 16 of the switch 14 connected to the third terminal 20, a signal passing through the second bandpass filter 48 is affected by the first bandpass filter 46 acting as a capacitive element. According to the simulation shown in FIG. 2, the imaginary component of the input impedance at the central frequency of the band V of the first bandpass filter 46 is about −74Ω. This effect of the first bandpass filter 46 on the impedance matching is canceled by the matching circuit 38. That is, as shown in FIG. 4, the marker m1 lies in an inductive area in the Smith chart showing the input impedance of the matching circuit 38; and thus, when the second bandpass filter 48 is actuated, a signal passing through the second bandpass filter 48 is affected by the matching circuit 38 acting as an inductive element. According to the simulation shown in FIG. 4, the imaginary component of the input impedance at the central frequency of the band V of the matching circuit 38 is about +74Ω. Thus, the matching circuit 38 is configured as follows: the imaginary component of an input impedance in the second passband of the first filter circuit 34 (which is equal to the input impedance in the second passband of the first bandpass filter 46 as seen from the balanced ports P3-2, P3-3 in the example shown in FIG. 1) as seen from the balanced ports P1-2, P1-3 under the condition where the first terminal 16 of the switch 14 is disconnected from the second terminal 18 and the junctions J1, J2 are opened, has an opposite polarity (the sign of positive or negative) than, and substantially the same amplitude as, the imaginary component of the input impedance in the second passband of the matching circuit 38 alone as seen from the output terminals 40-$a$, 40-$b$. Accordingly, the matching circuit 38 can cancel the effect of the first bandpass filter 46 on the impedance matching occurring when the second bandpass filter 48 is being actuated. In this simulation, the effect on a passing signal in the second passband of the first bandpass filter 46 can be canceled by setting the inductance value of the inductor 54 at 13.5 nH.

Meanwhile, as shown in FIG. 3, the marker m2 lies in a capacitive area in the Smith chart showing the input impedance of the second bandpass filter 48; and thus the bandpass filter 48 acts as a capacitive element on the first bandpass filter 46. Accordingly, when the first bandpass filter 46 is actuated with the first terminal 16 of the switch 14 connected to the second terminal 18, a signal passing through the first bandpass filter 46 is affected by the second bandpass filter 48 acting as a capacitive element. According to the simulation shown in FIG. 3, the imaginary component of the input impedance at the central frequency of the band VIII of the second bandpass filter 48 is about −198Ω. Further, as shown in FIG. 4, the marker m2 lies in the inductive area in the Smith chart showing the input impedance of the matching circuit 38; and thus the imaginary component of the input impedance of the matching circuit 38 at the central frequency of the band VIII is about 80Ω. Accordingly, the effect of the second bandpass filter 48 on the impedance matching occurring when the first bandpass filter 46 is being actuated cannot be canceled by only the matching circuit 38 optimized to cancel the effect of the first bandpass filter 46.

In an embodiment according to the present invention, the phase shifters 50, 52 provided subsequently to the second bandpass filter 48 varies the effect of the second bandpass filter 48 on a signal passing through the first bandpass filter 46, and the matching circuit 38 also cancels the effect of the second bandpass filter 48. In this simulation, the characteristic impedance of the phase shifters 50, 52 is set at 50Ω and the line length thereof is set such that the phase shifters rotate an input signal of 0.95 GHz by 25°. Thus, as shown in FIG. 5, the frequency characteristics of the input impedance of the second filter circuit 36 is equal to the frequency characteristics of the input impedance of the second bandpass filter 48 alone as shown in FIG. 3 rotated clockwise by an angle in accordance with the line length of the phase shifters 50, 52. In a Smith chart shown in FIG. 5, the marker m2 lies at a position with a phase lag of the electrical length of the phase shifters (a position reached by rotating clockwise), as compared to the frequency characteristics of the input impedance of the second bandpass filter 48 alone shown in FIG. 3. Due to this phase rotation, the imaginary component of the input impedance at the central frequency of the band VIII of the second filter circuit 36 is about −80Ω. As stated above, the imaginary component of the input impedance at the central frequency of the band VIII of the matching circuit 38 is about +80Ω. Therefore, the effect of the second bandpass filter 48 on the impedance matching in the first passband occurring when the first bandpass filter 46 is being actuated can be canceled by the matching circuit 38.

Thus, the matching circuit 38 is configured as follows: the imaginary component of an input impedance in the second passband of the first filter circuit 34 as seen from the balanced ports P1-2, P1-3 under the condition where the first terminal 16 of the switch 14 is disconnected from the second terminal 18 and the junctions J1, J2 are opened, has an opposite polarity than, and substantially the same amplitude as, the imaginary component of an input impedance in the second passband of the matching circuit 38 alone as seen from the output terminals 40-$a$, 40-$b$. Accordingly, the effect of the first bandpass filter 46 on the impedance matching occurring when the second bandpass filter 48 is being actuated can be canceled by the matching circuit 38; and the impedance matching in the second passband can be maintained. Accordingly, the phase shifters 50, 52 are configured as follows: the imaginary component of an input impedance in the first passband of the second filter circuit 36 as seen from the balanced ports P2-2, P2-3 under the condition where the first terminal 16 of the switch 14 is disconnected from the second terminal 20 and the junctions J1, J2 are opened, has an opposite polarity than, and substantially the same amplitude as, the imaginary component of an input impedance in the first passband of the matching circuit 38 alone as seen from the output terminals 40-$a$, 40-$b$. Accordingly, the effect of the second bandpass filter 48 on the impedance matching occurring when the first bandpass filter 46 is being actuated can also be canceled by the matching circuit 38; and the impedance matching in the first passband can be maintained Therefore, in an embodiment, the phase of a reflection coefficient in the second passband of the first bandpass filter 46 as seen from the balanced ports P3-2, P3-3 under the condition where the first terminal 16 of the switch 14 is disconnected from the second terminal 18 and the junctions J1, J2 are opened, is compared to the phase of a reflection coefficient in the first passband of the second bandpass filter 48 as seen from the balanced ports P4-2, P4-3 under the condition where the first terminal 16 of the switch 14 is disconnected from the third terminal 20, the junctions J1, J2 are opened, and the phase shifters 50, 52 are removed. The phase shifters 50, 52 are provided to the filter circuit having the filter element of which the phase of the reflection coefficient is leading by 0° to 180°. For example, in the examples shown in FIGS. 2 to 5, the phase of the reflection coefficient in the first passband of the second bandpass filter 48 shown in FIG. 3 (corresponding to the phase of the marker m2 in FIG. 3) is leading by about 50° the phase of the reflection coefficient in the second passband of the first bandpass filter 46 shown in FIG. 2 (corresponding to the phase of the marker m1 in FIG. 2) (that is, the phase of the marker m2 in FIG. 3 lies at the position of the marker m1 in FIG. 2 rotated counterclockwise by about 50°). The phase shifters 50, 52 are connected to the second bandpass filter 48 having a reflection coefficient whose phase is relatively leading. Which of the phases of the bandpass filter 46 and the bandpass filter 48 is leading depends on the specific configurations of these bandpass filters. Accordingly, unlike the examples shown in FIGS. 2 and 3, in the case where the phase of the reflection coefficient in the second passband of the bandpass filter 46 is leading the phase of the reflection coefficient in the first passband of the bandpass filter 48, the phase shifters are provided to the first filter circuit 34 having the bandpass filter 46.

Figure 6A:
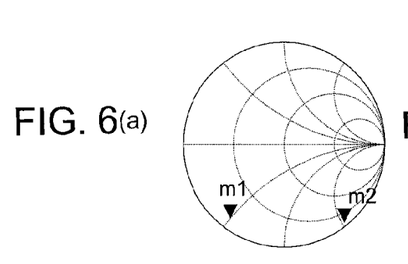
FIGS. 6*a* to 6*d* are schematic diagrams of phase difference between reflection coefficients.
Figure 6B:
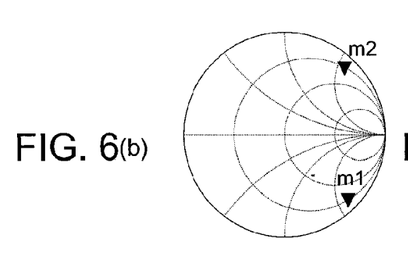
Figure 6C:
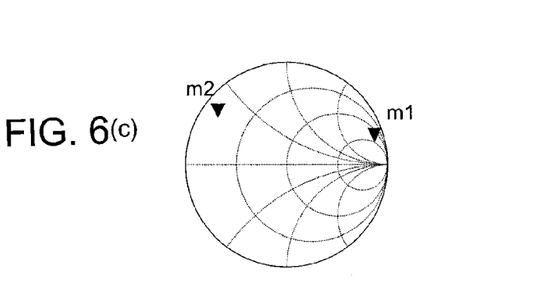
Figure 6D:
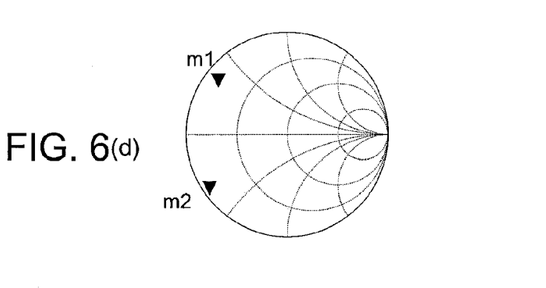

FIGS. 2 and 3 show examples wherein both the phase of the reflection coefficient in the second passband of the first bandpass filter 46 (the phase of the marker m1) and the phase of the reflection coefficient in the first passband of the second bandpass filter 48 (the phase of the marker m2) lie in the range from −180° to 0°. The phase of the reflection coefficient of each bandpass filter may be various values. Other examples of the reflection coefficients of the first bandpass filter 46 and the second bandpass filter 48 will now be described with reference to FIG. 6. FIGS. 6a to 6d schematically show various examples wherein the configurations and passbands of the first bandpass filter 46 and the second bandpass filter 48 are varied. In these examples, the phase of the reflection coefficient in the first passband of the second bandpass filter 48 (denoted by the marker m2) as seen from the balanced ports P4-2, P4-3 under the condition where the first terminal 16 of the switch 14 is disconnected from the third terminal 20, the junctions J1, J2 are opened, and the phase shifters 50, 52 are removed, is leading by 0° to 180° the phase of the reflection coefficient in the second passband of the first bandpass filter 46 (denoted by the marker m1) as seen from the balanced ports P3-2, P3-3 under the condition where the first terminal 16 of the switch 14 is disconnected from the second terminal 18 and the junctions J1, J2 are opened As FIGS. 2 and 3, FIG. 6a shows an example wherein the phase of the marker m1 lies in the range from −180° to −90°, and the phase of the marker m2 lies in the range from −90° to 0°. FIG. 6b shows an example wherein the phase of the marker m2 lies in the range from 0° to 90°, and the phase of the marker m1 lies in the range from −90° to 0°. FIG. 6c shows an example wherein the phase of the marker m2 lies in the range from 90° to 180°, and the phase of the marker m1 lies in the range from 0° to 90°. FIG. 6d shows an example wherein the phase of the marker m2 lies in the range from −180° to −90°, and the phase of the marker m1 lies in the range from 90° to 180°. In any of the examples shown, the phase of the marker m2 is leading, by 0° to 180°, the phase of the marker m1. This phase difference, therefore, is adjusted by providing phase shifters to the second filter circuit 36 including the second bandpass filter 48 corresponding to the marker m2. FIGS. 6a to 6d show examples wherein the markers m1, m2 are in different quadrants on the Smith charts. The markers m1, m2 may be in the same quadrant. For example, both the markers m1, m2 may be in the range from −90° to 0°. Thus, in the case where the marker m1 and the marker m2 are in the same quadrant, the phase difference between these markers is in the range from 0° to 90°.

Figure 7A:
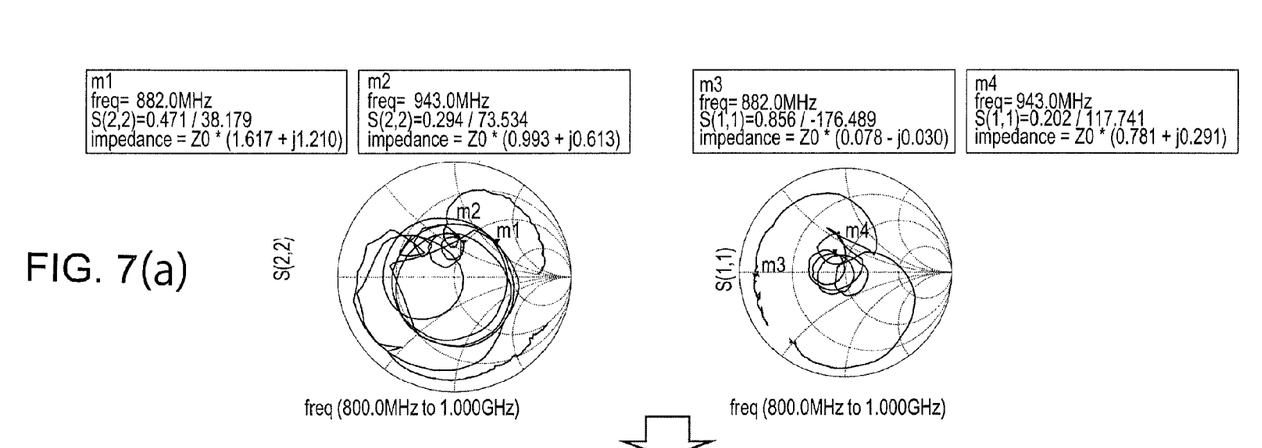
FIG. 7*a* is a Smith chart showing the frequency characteristics of an input impedance of the front-end module 10 (freed of phase shifters 50 and 52) as seen from an input terminal 12 and the output terminals 40 during operation of the bandpass filter 46.
Figure 7B:
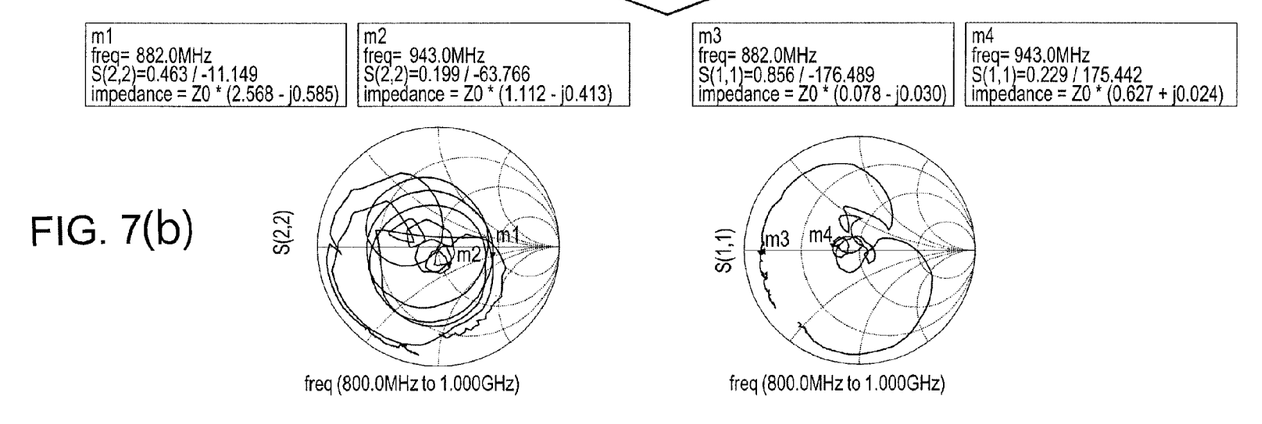
FIG. 7*b* is a Smith chart showing the frequency characteristics of an input impedance of the front-end module 10 (including phase shifters 50 and 52) as seen from the input terminal 12 and the output terminals 40 during operation of the bandpass filter 46.
Figure 8A:
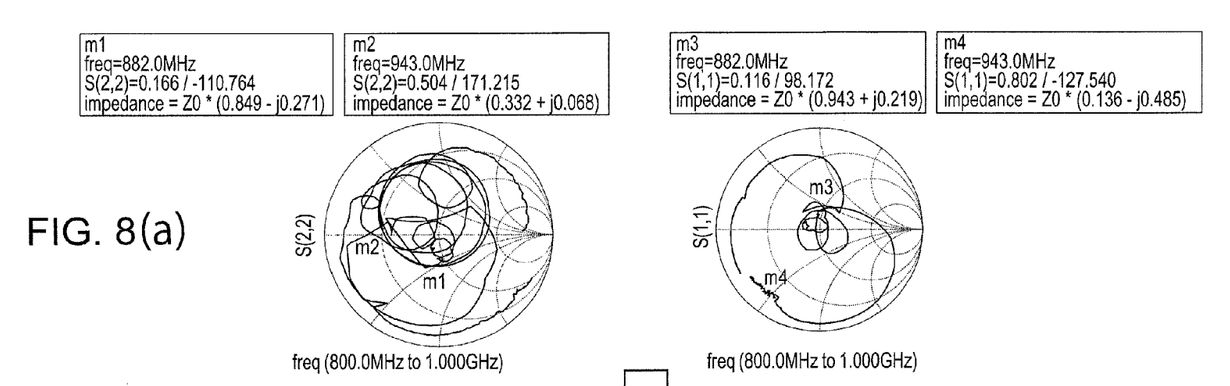
FIG. 8*a* is a Smith chart showing the frequency characteristics of an input impedance of the front-end module 10 (freed of phase shifters 50 and 52) as seen from an input terminal 12 and the output terminals 40 during operation of the bandpass filter 48.
Figure 8B:
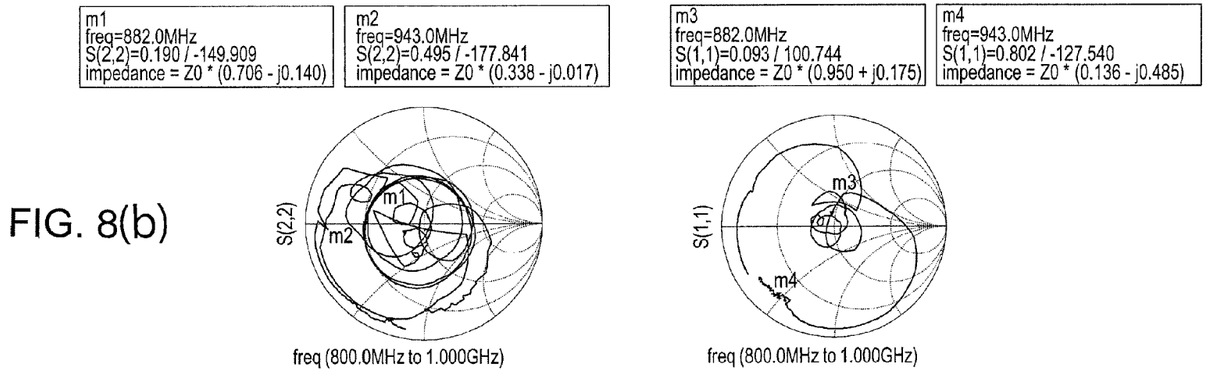

FIG. 7a and FIG. 7b are Smith charts showing the frequency characteristics of an input impedance of a front-end module taken when the first bandpass filter 46 is being actuated. FIG. 8a and FIG. 8b are Smith charts showing the frequency characteristics of an input impedance of the front-end module taken when the second bandpass filter 48 is being actuated. FIG. 7a and FIG. 8a show simulations of the front-end module 10 shown in FIG. 1 freed of the phase shifters 50, 52. FIG. 7b and FIG. 8b show simulations of the front-end module 10 shown in FIG. 1. In each figure, the chart on the left shows an input impedance of the respective module as seen from the output terminals 40-a, 40-b; and the chart on the right shows an input impedance of the respective module as seem from the antenna terminal 12. In these figures, the central frequency of the passband of the first bandpass filter 46 is denoted by the marker m2 or the marker m4, and the central frequency of the passband of the second bandpass filter 48 is denoted by the marker m1 or the marker m3. FIG. 7a and FIG. 8a show that, in a front-end module not having the phase shifters 50, 52, the markers m2, m4 are off the reference impedance. In contrast, FIG. 7b and FIG. 8b show that, in a front-end module 10 according to one embodiment of the present invention, the markers m2, m4 are matched with the reference impedance.

The circuit configuration of the front-end module 10 shown in FIG. 1 can be varied as necessary. For example, the passbands of the first and second bandpass filters 46, 48 described in this specification are examples; and filters having various passbands can be used in place of these filters. Further, the first filter circuit 34 may have another circuit element in addition to the first bandpass filter 46. For example, phase shifters respectively connected to the balanced ports P3-2, P3-3 may be provided subsequently to the first bandpass filter 46. In this case, the matching circuit 38 is configured such that the imaginary component of an input impedance in the second passband of the first filter circuit 34 as seen from the junctions J1, J2 has an opposite polarity than, and substantially the same amplitude as, the imaginary component of an input impedance in the second passband of the matching circuit 38 as seen from the output terminals 40-a, 40-b.

The configurations of the matching circuit 38 explicitly described in this specification are mere examples; the matching circuit 38 can be configured by, for example, combining passive elements such as a capacitor or an inductor in various embodiments. The input impedance of the matching circuit 38 can be adjusted desirably by adjusting the element values of the passive elements constituting the matching circuit 38. Further, a desired number of bandpass filters can be provided to the front-end module 10 according to the present invention; for example, three or more bandpass filters may be disposed in parallel subsequently to the switch 14. The front-end module according to the present invention can be installed in various wireless communication devices other than mobile phones. The front-end module according to the present invention can be downsized when it is constructed on a low temperature cofired ceramics (LTCC) multilayered circuit board. Embodiments of the present invention are not limited to those explicitly described above. The embodiments described in this specification are susceptible of various modifications within the purport of the present invention.

What is claimed is:

1. A front-end module comprising:
   an input terminal;
   one or more output terminals;
   a first filter circuit comprising a first input port and one or more first output ports and disposed between the input terminal and the one or more output terminals;

a second filter circuit comprising a second input port and one or more second output ports and disposed between the input terminal and the one or more output terminals;

a switch disposed between the input terminal and the first and second input ports, for connecting the input terminal selectively to the first and second filter circuits; and a matching circuit disposed between the one or more output terminals and one or more junctions between the one or more first output ports and the one or more second output ports, wherein the first filter circuit comprises a first filter element including a third input port and one or more third output ports, for passing a signal in a first passband, and wherein the second filter circuit comprises a second filter element including a fourth input port and one or more fourth output ports, for passing a signal in a second passband different from the first passband, and one or more first phase shifters disposed between the one or more fourth output ports of the second filter element and the matching circuit, and wherein a phase of a reflection coefficient in the first passband of the second filter element as seen from the one or more fourth output ports under a condition where the switch is switched to disconnect the input terminal from the second filter circuit, the one or more first phase shifters are removed, and the one or more junctions are opened, is leading, by 0° to 180°, a phase of a reflection coefficient in the second passband of the first filter element as seen from the one or more third output ports under a condition where the switch is switched to disconnect the input terminal from the first filter circuit and the one or more junctions are opened.

2. The front-end module according to claim 1, wherein an imaginary component of an input impedance in the second passband of the first filter circuit as seen from the one or more first output ports under the condition where the switch is switched to disconnect the input terminal from the first filter circuit and the one or more junctions are opened, has an opposite polarity than, and substantially the same amplitude as, an imaginary component of an input impedance in the second passband of the matching circuit.

3. The front-end module according to claim 1, wherein an imaginary component of an input impedance in the first passband of the second filter circuit as seen from the one or more second output ports under a condition where the switch is switched to disconnect the input terminal from the second filter circuit and the one or more junctions are opened, has an opposite polarity than, and substantially the same amplitude as, an imaginary component of an input impedance in the first passband of the matching circuit.

4. The front-end module according to claim 1, wherein the first filter circuit further comprises one or more second phase shifters having an electrical length shorter than that of the one or more first phase shifters and disposed between the first filter element and the matching circuit.

5. A wireless communication device comprising the front-end module according to claim 1.

* * * * *